US012703907B2

(12) United States Patent
Wu et al.

(10) Patent No.: US 12,703,907 B2
(45) Date of Patent: Aug. 11, 2026

(54) MOLYBDENUM SPUTTERING TARGET ASSEMBLY AND METHOD OF MAKING

(71) Applicant: Honeywell International Inc., Charlotte, NC (US)

(72) Inventors: Xiaodan Wu, Spokane, WA (US); Jaeyeon Kim, Liberty Lake, WA (US); Susan D. Strothers, Mead, WA (US); Rashmi Mohanty, Liberty Lake, WA (US); Alicia Im, Troy, MI (US)

(73) Assignee: Solstice Advanced Materials US, Inc., Morris Plains, NJ (US)

( * ) Notice: Subject to any disclaimer, the term of this patent is extended or adjusted under 35 U.S.C. 154(b) by 0 days.

(21) Appl. No.: 18/975,119

(22) Filed: Dec. 10, 2024

(65) Prior Publication Data

US 2025/0197987 A1 Jun. 19, 2025

Related U.S. Application Data

(60) Provisional application No. 63/610,598, filed on Dec. 15, 2023.

(51) Int. Cl.

| | |
|---|---|
| ***H01J 37/34*** | (2006.01) |
| ***C23C 14/34*** | (2006.01) |
| *B23K 20/02* | (2006.01) |
| *B23K 103/08* | (2006.01) |

(52) U.S. Cl.

CPC ...... *C23C 14/3414* (2013.01); *H01J 37/3426* (2013.01); *H01J 37/3435* (2013.01); *H01J 37/3491* (2013.01); *B23K 20/021* (2013.01); *B23K 2103/08* (2018.08); *H01J 2237/332* (2013.01)

(58) Field of Classification Search

None

See application file for complete search history.

(56) References Cited

U.S. PATENT DOCUMENTS

| | | | | |
|---|---|---|---|---|
| 3,170,234 | A | 2/1965 | Tarr | |
| 7,832,619 | B2 | 11/2010 | Butzer et al. | |
| 2004/0020769 | A1 * | 2/2004 | Ivannov | H01J 37/3426 228/195 |
| 2008/0127887 | A1 * | 6/2008 | Leung | H01J 37/3435 118/50.1 |
| 2008/0193798 | A1 * | 8/2008 | Lemon | B22F 3/162 204/192.1 |
| 2009/0010792 | A1 * | 1/2009 | Yi | H01L 21/76873 419/68 |

* cited by examiner

*Primary Examiner* — Jason Berman

(74) *Attorney, Agent, or Firm* — Faegre Drinker Biddle & Reath LLP

(57) ABSTRACT

A molybdenum sputtering target assembly includes molybdenum sputtering target diffusion bonded directly to a molybdenum backing plate. The molybdenum sputtering target consists of molybdenum and the molybdenum backing plate consists of molybdenum or a molybdenum alloy.

10 Claims, 2 Drawing Sheets

MOLYBDENUM SPUTTERING TARGET ASSEMBLY AND METHOD OF MAKING

CROSS-REFERENCE TO RELATED APPLICATION

This application claims priority to U.S. Provisional Application No. 63/610,598, filed Dec. 15, 2023, which is herein incorporated by reference in its entirety.

TECHNICAL FIELD

The present disclosure relates to sputtering target assemblies comprising a molybdenum sputtering target and a molybdenum containing backing plate.

BACKGROUND

Physical vapor deposition methodologies are used extensively for forming thin films of material over a variety of substrates. One area of importance for such deposition technology is semiconductor fabrication. A diagrammatic view of a portion of an exemplary physical vapor deposition ("PVD") apparatus 8 is shown in FIG. 1. In one configuration, a sputtering target assembly 10 comprises a backing plate 12 having a target 14 bonded thereto. A substrate 18 such as a semiconductive material wafer is within the PVD apparatus 8 and provided to be spaced from the target 14. A surface 16 of target 14 is a sputtering surface. As shown, the target 14 is disposed above the substrate 18 and is positioned such that sputtering surface 16 faces substrate 18. In operation, sputtered material 22 is displaced from the sputtering surface 16 of target 14 and used to form a coating (or thin film) 20 over substrate 18. Copper, copper alloys and aluminum alloys are currently used as interconnect materials in semiconductor manufacturing. A new interconnect material will be needed to support the need for faster, smaller and more energy efficient microelectronic devices over time. Two of the key materials parameters for these new interconnects are low film resistivity, often expressed as a figure of merit (bulk resistivity×mean free path) and electromigration resistance. Molybdenum has a smaller figure of merit than copper and alternatives such as tungsten, making it a good next-generation interconnect material candidate. Molybdenum also has a higher melting point than copper and aluminum alloys which leads to improved electromigration performance.

High power is typically required to sputter a molybdenum sputtering target. Thus, a diffusion-bonded target may be necessary. Prior sputtering target assemblies included a molybdenum sputtering target diffusion bonded to a copper-zinc backing plate. During sputtering, the temperature of the sputtering target and the backing plate go up and down during the duty cycles. Great thermal stress, due at least in part to coefficient of thermal expansion (CTE) mismatch between the target and backing plate during the thermal cycling, is generated at the bonding interface between the molybdenum sputtering target and the copper alloy backing plate. This stress can lead to either debonding or cracking of the sputtering target.

Alternatively, a molybdenum monolithic sputtering target has been used to avoid these concerns. A monolithic molybdenum target is formed from a single piece of molybdenum plate. The molybdenum plate must be thick, typically from about 0.9 inches to 1.3 inches, since a separate backing plate is not used with a monolithic assembly. The thickness requirement adds cost and causes difficulty in meeting the grain size requirements due to thermo-mechanical processing challenges such as insufficient total rolling reduction. For plates of the typical thickness, great efforts are needed to achieve an average grain size of less than 100 μm. Furthermore, it is more difficult to achieve a uniform grain size in these thicker plates. An improved molybdenum sputtering target assembly is needed.

SUMMARY

Embodiment 1 is a molybdenum sputtering target assembly including a molybdenum sputtering target consisting of molybdenum and a molybdenum backing plate consisting of molybdenum or a molybdenum alloy and diffusion bonded directly to the molybdenum sputtering target.

Embodiment 2 is the sputtering target assembly of Embodiment 1 wherein the molybdenum alloy is selected from the group consisting of titanium-zirconium-molybdenum Alloy, molybdenum tungsten alloy, molybdenum copper alloy, and molybdenum hafnium carbon alloy).

Embodiment 3 is the sputtering target assembly of Embodiment 1 wherein the molybdenum backing plate consists of molybdenum having a lower purity than the molybdenum of the molybdenum sputtering target.

Embodiment 4 is the sputtering target assembly of Embodiment 1 wherein the molybdenum sputtering target has an average grain size of less than about 100 μm.

Embodiment 5 is the sputtering target assembly of Embodiment 4 wherein the grain size differs by +/−5 μm through the thickness of the molybdenum sputtering target.

Embodiment 6 is the sputtering target assembly of Embodiment 1 wherein the molybdenum sputtering target has an average grain size of less than about 50 μm.

Embodiment 7 is the sputtering target assembly of Embodiment 1 wherein the molybdenum sputtering target is between about 0.2 inches and about 0.6 inches in thickness.

Embodiment 8 is a method for forming a sputtering target assembly which includes diffusion bonding a molybdenum sputtering target directly to a molybdenum backing plate by hot isostatic pressing at a pressure equal to or greater than 15 ksi and a temperature of from about 700° C. and about 1500° C. The molybdenum sputtering target consists of molybdenum and the molybdenum backing plate consists of molybdenum or a molybdenum alloy.

Embodiment 9 is the method of Embodiment 8 wherein the molybdenum alloy is selected from the group consisting of titanium-zirconium-molybdenum Alloy, molybdenum tungsten alloy, molybdenum copper alloy, and molybdenum hafnium carbon alloy).

Embodiment 10 is the method of Embodiment 8 wherein the molybdenum backing plate consists of molybdenum having a lower purity than the molybdenum of the molybdenum sputtering target.

Embodiment 11 is the method of Embodiment 8 wherein after the hot isostatic pressing, the molybdenum sputtering target has an average grain size of less than about 100 μm.

Embodiment 12 is the method of Embodiment 8 wherein after the hot isostatic pressing, the grain size differs by +/−5 μm through the thickness of the molybdenum sputtering target.

Embodiment 13 is the method of Embodiment 8 wherein after the hot isostatic pressing, the molybdenum sputtering target has an average grain size of less than about 50 μm.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
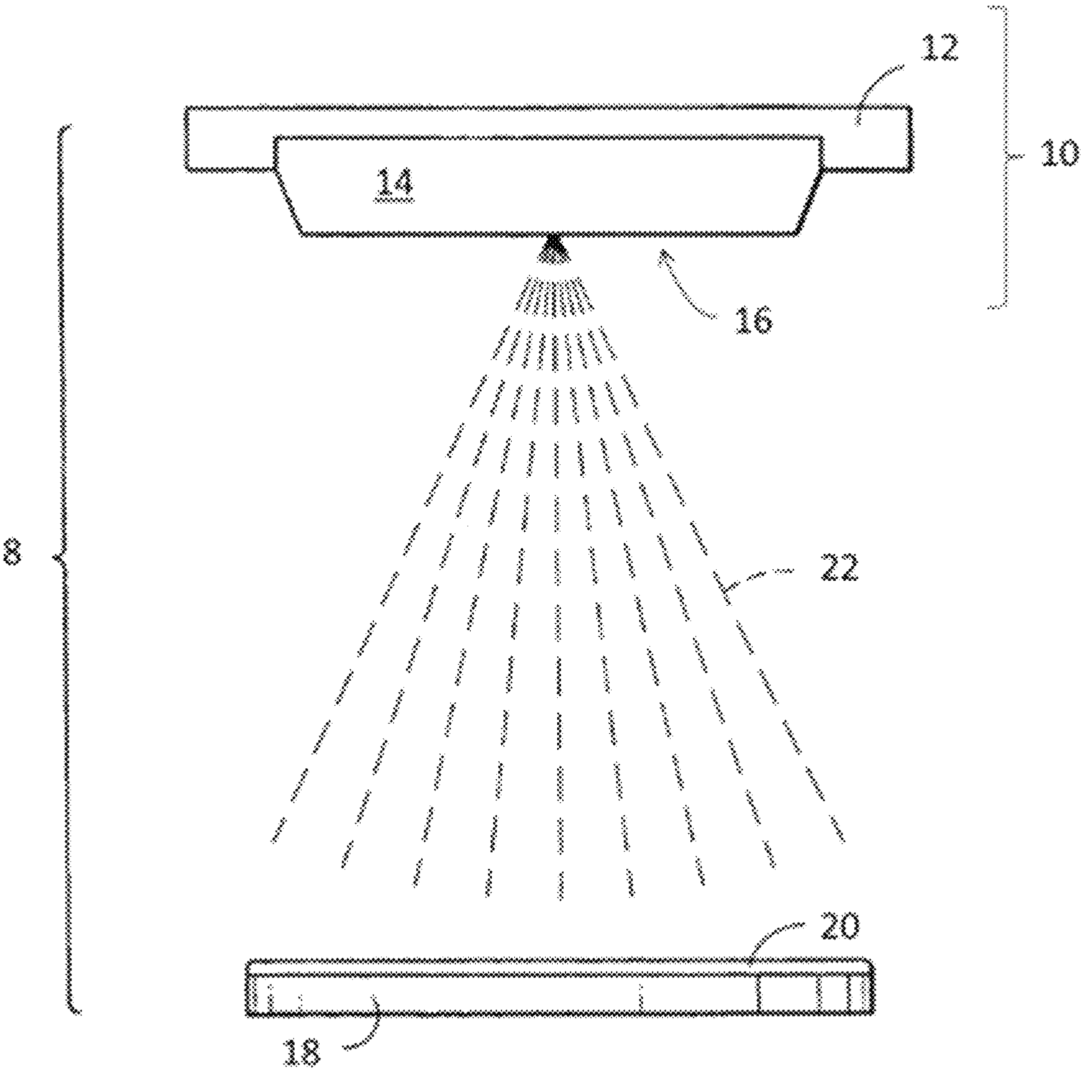
FIG. 1 is a schematic illustration of a sputtering apparatus.
Figure 2:
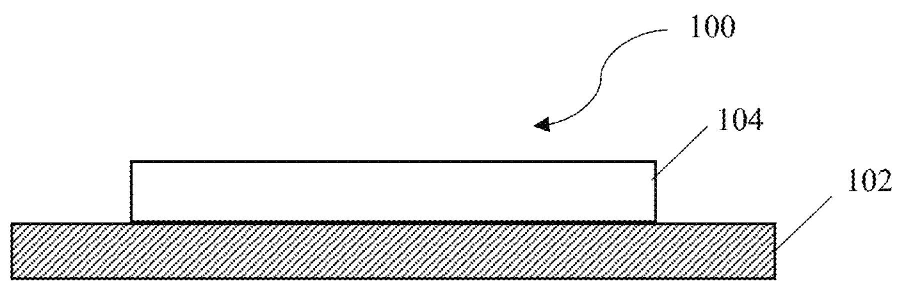
FIG. 2 is a schematic illustration of an exemplary molybdenum sputtering target assembly.

Disclosed herein is an improved molybdenum sputtering target assembly and a method of making the same. FIG. 2 is a schematic cross-sectional view of molybdenum sputtering target assembly 100 which includes molybdenum backing plate 102 and molybdenum sputtering target 104. Molybdenum backing plate 102 and molybdenum sputtering target are joined directly to one another by a diffusion bond.

Molybdenum sputtering target 104 is formed from 100% molybdenum and inevitable impurities. For example, molybdenum sputtering target 104 consists of or consists essentially of molybdenum. Sputtering target 104 has a sufficient average grain for interconnect material. For example, molybdenum sputtering target 104 has an average grain size less than about 100 μm. In some examples, molybdenum sputtering target 104 has an average grain size less than about 50 μm. In still further examples, molybdenum sputtering target 104 has an average grain size of about 20 μm to about 50 μm or about 30 μm.

Molybdenum sputtering target 104 may have uniform grain size through the thickness. Grain size uniformity can be determined by measuring the grain size at various locations across the thickness of the sputtering target. For example, the grain size can be measured at near the surface of the sputtering target and at the thickness center of the sputtering target. In some examples, the grain size differs by +/−5 μm through the thickness of the sputtering target.

Molybdenum sputtering target 104 has a thickness of from about 0.2 inches to about 0.6 inches. In comparison, a monolithic sputtering target typically has a thickness of about 0.9 inches to about 1.3 inches. A monolithic sputtering target also typically has a much bigger grain size, and the grain size is typically non-uniformly distributed through the thickness of the sputtering target.

In some embodiments, molybdenum backing plate 102 can be formed from 100% molybdenum and inevitable impurities or from a molybdenum alloy. For example, molybdenum backing plate 102 can consists of or consist essentially of molybdenum. In some embodiments, molybdenum backing plate 102 can be formed from a lower purity molybdenum than molybdenum sputtering target 104. In other embodiments, molybdenum backing plate 102 can be formed from a molybdenum alloy. Exemplary molybdenum alloys include TZM (titanium-zirconium-molybdenum Alloy), MoW (molybdenum tungsten alloy) (i.e., 30-50 wt. % W, such as Mo30W containing 30 wt. % W), MoCu (molybdenum copper alloy) (i.e., Mo15Cu containing 15 wt. % Cu), MHC (molybdenum hafnium carbon alloy) (i.e., 1.2 wt. % Hf, 0.5-0.12 wt. % C).

In some embodiments, molybdenum sputtering target 104 can be formed from 100% molybdenum having a CTE of 5 μm/(m·K) and molybdenum backing plate 102 can be formed from 100% molybdenum having a CTE of 5 μm/(m·K) TZM alloy having a CTE from 4.9-5.3 μm/(m·K), Mo15Cu alloy having a CTE of 6.75 μm/(m·K), or M30W alloy having a CTE of 4.85 μm/(m·K). In this way, the CTEs of molybdenum sputtering target 104 and molybdenum backing plate 102 are the same or are substantially the same, which reduces the likelihood that molybdenum sputtering target 104 will crack during use and bonding.

Molybdenum sputtering target 104 and molybdenum backing plate 102 are diffusion bonded to one another. In some embodiments, molybdenum sputtering target 104 and molybdenum backing plate 102 are bonded by hot isostatic pressing (HIP) or vacuum hot press. In some embodiments, molybdenum sputtering target 104 and molybdenum backing plate 102 are bonded by HIP at a pressure greater than or equal to 15 kilopound force per square inch (ksi) (103,421 kilopascals) and a temperature from about 700° C. and about 1500° C. In other embodiments, molybdenum sputtering target 104 and molybdenum backing plate 102 are bonded by HIP at a pressure greater than or equal to 15 ksi (103,421 kilopascals) and a temperature from about 700° C. and about 1300° C.

In some embodiments, molybdenum sputtering target 104 and molybdenum backing plate 102 are bonded directly to one another. For example, in some embodiments there is no joining material, such as a joining powder, between molybdenum sputtering target 104 and molybdenum backing plate 102. Directly joining molybdenum sputtering target 104 to molybdenum backing plate 102 reduces the likelihood that molybdenum sputtering target 104 will crack during use because of a difference in CTEs.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above-described features.

What is claimed is:

1. A molybdenum sputtering target assembly comprising:

a molybdenum sputtering target consisting of molybdenum and having a thickness of about 0.2 inches and about 0.6 inches; and a molybdenum backing plate consisting of molybdenum or a molybdenum alloy, the molybdenum backing plate immediately adjacent to and diffusion bonded directly to the molybdenum sputtering target, wherein the molybdenum sputtering target has an average grain size of less than about 50 μm and wherein the grain size differs by not more than +/−5 μm through the thickness of the molybdenum sputtering target.

2. The molybdenum sputtering target assembly of claim 1, wherein the molybdenum alloy is selected from the group consisting of titanium-zirconium-molybdenum alloy, molybdenum tungsten alloy, molybdenum copper alloy, and molybdenum hafnium carbon alloy.

3. The molybdenum sputtering target assembly of claim 1, wherein the molybdenum backing plate consists of molybdenum having a lower purity than the molybdenum of the molybdenum sputtering target.

4. The molybdenum sputtering target assembly of claim 1, wherein the molybdenum sputtering target is between about 0.2 inches and about 0.6 inches in thickness.

5. A method for forming a sputtering target assembly, the method comprising:

positioning a molybdenum sputtering target immediately adjacent to a molybdenum backing plate; and diffusion bonding the molybdenum sputtering target directly to the molybdenum backing plate by hot isostatic pressing at a pressure equal to or greater than 15 ksi and a temperature of from about 700° C. and about 1500° C., wherein the molybdenum sputtering target consists of molybdenum and has a thickness of about 0.2 inches and about 0.6 inches, and wherein the molybdenum backing plate consists of molybdenum or a molybdenum alloy and wherein after the diffusion bonding, the molybdenum sputtering target has an average grain size of less than about 50 μm and wherein the grain size differs by +/−5 μm through the thickness of the molybdenum sputtering target.

6. The method of claim 5, wherein the molybdenum alloy is selected from the group consisting of titanium-zirconium-molybdenum Alloy, molybdenum tungsten alloy, molybdenum copper alloy, and molybdenum hafnium carbon alloy).

7. The method of claim 5 wherein the molybdenum backing plate consists of molybdenum having a lower purity than the molybdenum of the molybdenum sputtering target.

8. The method of claim 5, wherein after the hot isostatic pressing, the molybdenum sputtering target has an average grain size of less than about 100 μm.

9. The method of claim 5, wherein after the hot isostatic pressing, the grain size differs by +/−5 μm through the thickness of the molybdenum sputtering target.

10. The method of claim 5, wherein after the hot isostatic pressing, the molybdenum sputtering target has an average grain size of less than about 50 μm.

* * * * *